United States Patent [19]
Wolters et al.

[11] Patent Number: 5,360,994
[45] Date of Patent: Nov. 1, 1994

[54] SEMICONDUCTOR DEVICE HAVING A SURFACE WITH A BARRIER LAYER OF $Ti_xW_{1-x}$

[75] Inventors: Robertus A. M. Wolters; Edwin T. Swart; Albertus G. Dirks, all of Eindhoven, Netherlands

[73] Assignee: U.S. Philips Corporation, New York, N.Y.

[21] Appl. No.: 53,993

[22] Filed: Apr. 27, 1993

[30] Foreign Application Priority Data

Apr. 28, 1992 [EP] European Pat. Off. ........ 92201178.8

[51] Int. Cl.⁵ .................................... H01L 23/48
[52] U.S. Cl. ................... 257/751; 257/764; 257/767; 257/770; 257/763
[58] Field of Search .......... 257/763, 764, 767, 770, 257/751

[56] References Cited

U.S. PATENT DOCUMENTS

| | | | |
|---|---|---|---|
| 4,491,860 | 1/1985 | Lim | 257/764 |
| 5,019,234 | 5/1991 | Harper | 204/192.17 |
| 5,028,531 | 7/1991 | Dohjo et al. | 257/764 |

OTHER PUBLICATIONS

R. S. Nowicki et al. "Studies of the Ti-W/AU Metallization on Aluminum" Apr. 7, 1978 Thin Solid Films 53 pages, 195-205.

P. B. Ghate et al. "Application of Ti:W Barrier Metallization for Integrated Circuits" *Thin Solid Films,* 53 Apr. 28, 1978 pp. 117-128.

*Primary Examiner*—Rolf Hille
*Assistant Examiner*—Roy Potter
*Attorney, Agent, or Firm*—Steven R. Biren

[57] ABSTRACT

A semiconductor device with a semiconductor body (1) whose surface (4) is provided with a barrier layer (8) of $Ti_xW_{1-x}$, with $0.1<x<0.3$. The barrier layer (8) is used, for example, between contact zones (3) of silicon or metal silicides provided in the semiconductor body (1) and conductor tracks (9) of aluminium provided on the surface (4) with the purpose of counteracting chemical reactions between silicon and aluminium. According to the invention, the barrier layer (8) is so deposited that in this layer the distance between the (100) lattice faces of tungsten is greater than 2.25Å. It is achieved in this way that the barrier layer (8) has equally good or even better barrier properties as/than a $Ti_xW_{1-x}$ layer which has been exposed to air for a few days. It is found that, if the barrier layer (8) is deposited by means of a sputter deposition process, the distance between the (100) lattice faces of W is determined by the voltage applied to the sputter target during deposition.

2 Claims, 6 Drawing Sheets

SEMICONDUCTOR DEVICE HAVING A SURFACE WITH A BARRIER LAYER OF $Ti_xW_{1-x}$

BACKGROUND OF THE INVENTION

The invention relates to a semiconductor device with a semiconductor body of which a surface is provided with a barrier layer of $Ti_xW_{1-x}$, with $0.1<x<0.3$. The invention also relates to a method of manufacturing such a semiconductor device.

A barrier layer of $Ti_xW_{1-x}$ is used in the manufacture of semiconductor devices, for example, between contact zones of silicon or metal silicides provided in the semiconductor body and aluminium conductor tracks provided on the surface with the object of preventing chemical reactions between silicon and aluminium. These reactions could occur during the subsequent manufacture of the semiconductor device during which the semiconductor body is heated to a comparatively high temperature several more times.

A barrier layer of $Ti_xW_{1-x}$ is found in practice not to form an absolute barrier. Ti and W from the layer form chemical compounds with aluminium. Although the compounds with tungsten are formed less readily than those with titanium, so that in fact a layer without titanium would be preferable, in practice nevertheless 10 to 30 at. % titanium is added to the layer. This is done to ensure that the layer adheres well to the subjacent substrate and to ensure that the layer forms a low-ohmic contact with the subjacent silicon or metal silicide. It is also done, however, to ensure that the layer can be deposited by means of a practical sputtering deposition process.

In a sputtering deposition process, a slice of semiconductor material is positioned in a reaction chamber opposite to a target of the material to be deposited, upon which a plasma is generated in the vicinity of the target. Ions from the plasma hit the target and detach atoms from it, part of which atoms reach the slice and form a layer there. In a later stage of manufacture of the semiconductor device, the slice is subdivided into a number of separate semiconductor bodies. The atoms detached from the target do not only end up on the slice during the sputtering deposition process, but also on the walls of the reactor chamber, so a layer is also deposited on these walls. When the process is repeated, layers being deposited on other slices, the layer on the walls increases in thickness. If pure tungsten is deposited, a layer with bad adhesion is formed on the walls. Once the pure tungsten layer has reached a thickness of approximately 20 μm on the walls, tungsten particles will flake off from this layer and may end up on the surface of the semiconductor body. Such particles are not desired there. The reaction chamber, accordingly, must be cleaned before the layer on the walls has reached this critical thickness. The addition of 10 to 30% titanium to the layer achieves that the layer on the reaction chamber walls has a much better adhesion and does not start flaking off in practice until after it has reached a thickness of approximately 300 μm. This means that the reaction chamber need not be cleaned so often, which is of great practical advantage.

U.S. Pat. No. 5,019,234 discloses a semiconductor device of the kind mentioned in the opening paragraph in which a barrier layer of $Ti_xW_{1-x}$ is used with barrier properties which are improved in that the layer is exposed to the air for some time before a layer of aluminium is deposited on it. It is achieved in this way that the layer reacts less readily with the aluminium lying over it.

The use of the known barrier layer has the disadvantage that, if the exposure to air of the barrier layer is to provide a practical improvement of the barrier properties, this exposure must last for some days. This means that the manufacturing process of the semiconductor device is in fact delayed by that same number of days. In addition, exposure to air has the disadvantage that deposition of the barrier layer and of the layer of aluminium to be deposited thereon cannot be carried out in a modern multiple-chamber deposition device. In such a device, a semiconductor slice is transported from one deposition chamber to the other at low pressure, a layer being deposited in each chamber. Sometimes an additional etching treatment is carried out in an extra chamber. In such a device, for example, the surface of the slice may then first be cleaned by etching, then a $Ti_xW_{1-x}$ barrier layer may be deposited, and finally an aluminium layer may be deposited without the vacuum in the device being broken.

SUMMARY OF THE INVENTION

The invention has for its object inter alia to counteract the said disadvantages. According to the invention, the semiconductor device of the kind mentioned in the opening paragraph is for this purpose characterized in that the distance between the (100) lattice faces of W is greater than 2.25Å in the barrier layer.

It is found that such a barrier layer has equally good or even better barrier properties as than a layer which has been exposed to air for a few days.

This was demonstrated by means of tests in which a barrier layer of $Ti_xW_{1-x}$ and a layer of aluminium were deposited in that order on different silicon slices provided with a layer of silicon oxide in a multiple-chamber deposition device as described above. The layers were deposited under different sputtering conditions. The two layers were provided on some slices without these slices being taken from the deposition device, whereas other slices were taken from the deposition device between the depositions of the two layers and were exposed to air for a few days. Barrier layers were thus investigated during the tests which had not been exposed to air before deposition of the aluminium layer and which had, during the tests, the silicon slices provided with the barrier layer and the aluminium layer were heated in vacuum to a temperature of 450° C. for some time. The electrical square resistance of the aluminium layer was measured during this. Since chemical compounds arising from reactions between titanium and tungsten from the barrier layer and aluminium have a resistance which is much greater than that of aluminium, the measured resistance increases in proportion as aluminium is converted into these compounds. It is obviously desirable for as little as possible aluminium to be converted. It was found in these tests that the sputtering conditions can be so chosen that less aluminium is converted in the said reactions in the case of a barrier layer not exposed to air than in the case of a barrier layer which had been exposed to air. The sputtering conditions must be so chosen in this case that the distance between the (100) lattice faces of W is greater than 2.25Å in the barrier layer.

Preferably, the deposition conditions are so chosen that the distance between the (100) lattice faces of W is greater than 2.25Å but smaller than 2.27Å in the barrier layer. In that case the conversion of aluminium with the use of a barrier layer not exposed to air during the said tests is not only smaller than with the use of a barrier layer exposed to air, but it has in addition a minimum value.

A semiconductor device with a semiconductor body of which a surface is provided with a barrier layer of $Ti_xW_{1-x}$, with $0.1<x<0.3$, may be manufactured in a simple manner by means of a method in which a slice of semiconductor material is arranged in a reaction chamber parallel to a plane $Ti_yW_{1-y}$ target, with $0.1<y<0.3$, and to a plane conductive ring surrounding the target, after which argon is conducted into the reaction chamber and such a voltage is applied between the target and the conductive ring that a plasma is generated which is confined between the target and the slice and in a space close to the target by means of magnets positioned behind the target.

The layer thus deposited on the surface of the semiconductor body in practice has a composition which slightly deviates from that of the target. A fraction x of titanium is present in the deposited layer, whereas this is a fraction y in the target. It is found in practice that x is slightly smaller than y.

According to the invention, this method is characterized in that such a voltage is applied between target and conductive ring during deposition that a barrier layer is formed in which the distance between the (100) lattice faces of W is greater than 2.25Å. It was surprisingly found that there is a relation between the voltage at the target and the said lattice distance, so that it is possible to control the deposition process in such a manner that a layer with the desired lattice distance is deposited. To ensure that the distance between the (100) lattice faces of W is greater than 2.25Å, according to the invention, a voltage higher than 400 V is applied between the target and the conductive ring surrounding the target during deposition. The layer thus formed exhibits equally good or even better barrier properties as/than a layer which has been exposed to air for a few days.

Preferably, such a voltage is applied between the target and the conductive ring surrounding the target during deposition that a barrier layer is formed in which the distance between the (100) lattice faces of W is greater than 2.25Å but smaller than 2.27Å. In that case, according to the invention, a voltage is applied between the target and the conductive ring surrounding the target during deposition which is higher than 400 V and lower than 550 V. A layer is then formed whose barrier properties are not only better than those of a barrier layer exposed to air, but in addition have an optimum value.

BRIEF DESCRIPTION OF THE DRAWING

The invention will be explained in more detail below by way of example with reference to a drawing and several embodiments. In the drawings.

DESCRIPTION OF THE PREFERRED EMBODIMENTS

Figure 1:
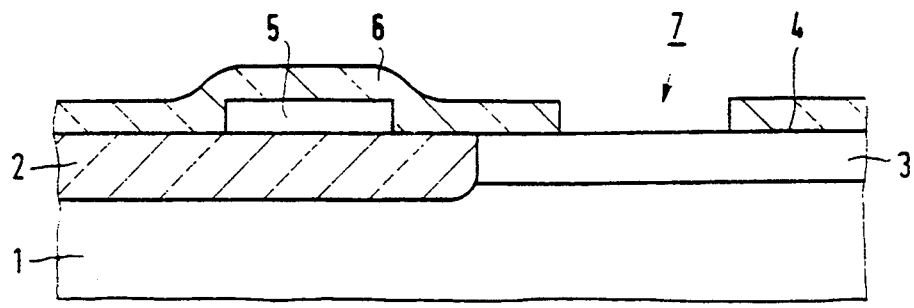
FIGS. 1 to 3 diagrammatically and in cross-section show several stages in the manufacture of the semiconductor device according to the invention, FIG. 4 diagrammatically shows a multiple-chamber deposition device for carrying out the method according to the invention, FIG. 5 diagrammatically shows one of the reaction chambers of the device according to FIG. 4.
Figure 2:
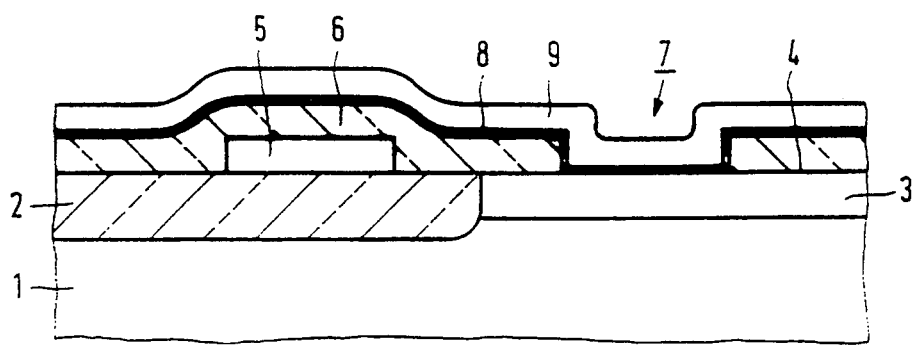
Figure 3:
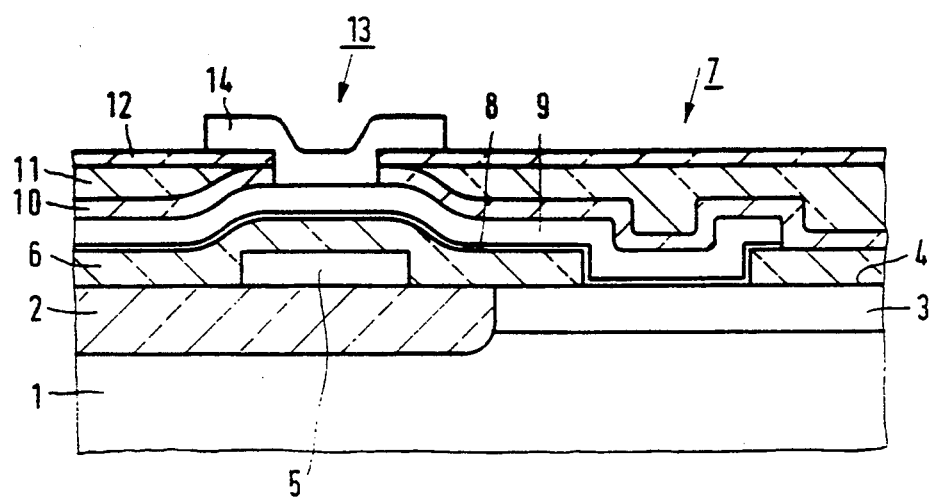

FIGS. 1 to 3 diagrammatically and in cross-section show several few stages in the manufacture of a semiconductor device with a semiconductor body 1 of which a surface 4 is provided with a barrier layer 8 of $Ti_xW_{1-x}$, with $0.1<x<0.3$. The semiconductor body 1, for example, is an n-type doped semiconductor body 1 of silicon in which field oxide regions 2 and p-type doped semiconductor zones 3 are provided in usual manner, adjoining the surface 4. Conductor tracks 5 of polycrystalline silicon are provided on the surface 4 and are covered with an insulating layer 6 of silicon oxide. Windows 7 are provided in the insulating layer 6 for contacting the semiconductor zones 3. After that, an approximately 100 nm thick barrier layer of $Ti_xW_{1-x}$, with $0.1<x<0.3$, is provided on the surface 4, and on top of that an approximately 500 nm thick layer of aluminium 9. Up to a few percents of silicon and copper may be added to this layer 9. The semiconductor zones may aim be provided with a top layer of a metal silicide in usual manner before the barrier layer 8 is deposited.

After the layers $Ti_xW_{1-x}$ 8 and aluminium 9 have been etched into a pattern in usual manner, a package of insulating layers 10, 11, 12 is provided in that order. A layer of silicon oxide 10 is deposited in a plasma deposition process (PECVD), a layer of spin-on glass (SOG) 11 is deposited by means of a spin-on method, and then a layer of silicon oxide 12 is provided in a plasma deposition process (PECVD) again. Contact windows 13 are provided in the layer package 10, 11, 12, so that a conductor pattern 14 provided on the package makes contact with the aluminium layer 9. The upper silicon oxide layer 12 is comparatively plane because the use of the layer of spin-on glass 11 in the layer package 10, 11, 12 has a smoothing effect.

The barrier layer 8 of $Ti_xW_{1-x}$ is used in the manufacture of semiconductor devices to ensure that the aluminium layer 9 adheres well to the silicon oxide layer 6 and to counteract chemical reactions between the silicon of semiconductor zones 3 provided in the semiconductor body 1 and made of silicon or metal silicides and the aluminium of the conductor tracks 9 provided on the surface. These reactions could occur during subsequent manufacturing steps of the semiconductor device during which the semiconductor body is heated to comparatively high temperatures several more times. During deposition of the silicon oxide layer 10, the semiconductor body 1 is heated for approximately 10 minutes at 300° C., after the deposition of the spin-on glass layer 11 for approximately 40 minutes at 425 ° C. for densifying the layer, and again for approximately 10 minutes at 300° C. during deposition of the silicon oxide layer 12.

After the conductor pattern 14 has been provided, during which the semiconductor body 1 reaches a temperature of approximately 200° C., a layer of silicon oxide and a layer of silicon nitride are also deposited. During these deposition processes, the semiconductor body is at a temperature of 300° C for approximately 30 minutes. Finally, a final heat treatment is carried out for approximately 20 minutes at a temperature of 425° C. Aluminium substantially does not react with Ti and W from the barrier layer 8 during heat treatments at a temperature of 300° C. or lower, this happens mainly during the treatments at temperatures above 400° C. Of practical importance in view of the said chemical reactions are only the heat treatments above 400° C., in this example a total of 60 minutes at a temperature of 425 ° C.

Figure 4:
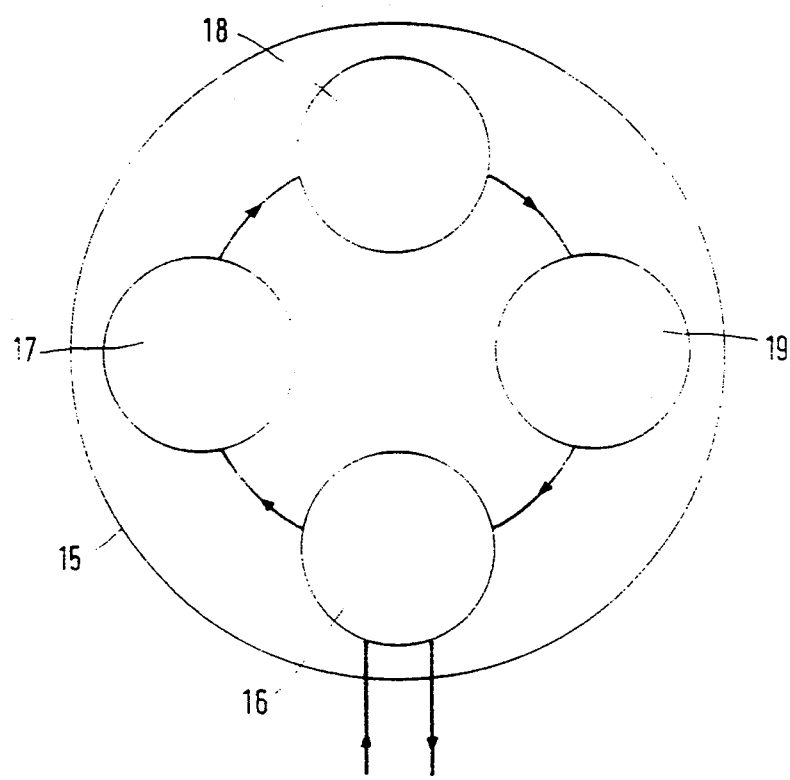

FIG. 4 diagrammatically shows a multiple-chamber deposition device for carrying out the method according to the invention. This device comprises a vacuum-tight housing 15 within which four chambers 16, 17, 18, 19 are arranged in this example. Inside the housing 20, semiconductor slices may be transported from one chamber to the next under vacuum, as is diagrammatically indicated with arrows. Through a first chamber 16—the load lock—the semiconductor slices can be put into and taken from the housing. In the second chamber 17, for example, the slices are subjected to a usual sputter etching treatment for cleaning the slice surface. The barrier layer 8 is deposited in the third chamber 18 and the aluminium layer 9 in the fourth chamber 19. Finally, the slices are taken from the housing through the first chamber 16 again. The slices then comprise a large number of semiconductor devices in a stage of manufacture as shown in FIG. 2. In a later stage of manufacture of the semiconductor device, the slices are subdivided into a number of separate semiconductor bodies 1.

Figure 5:
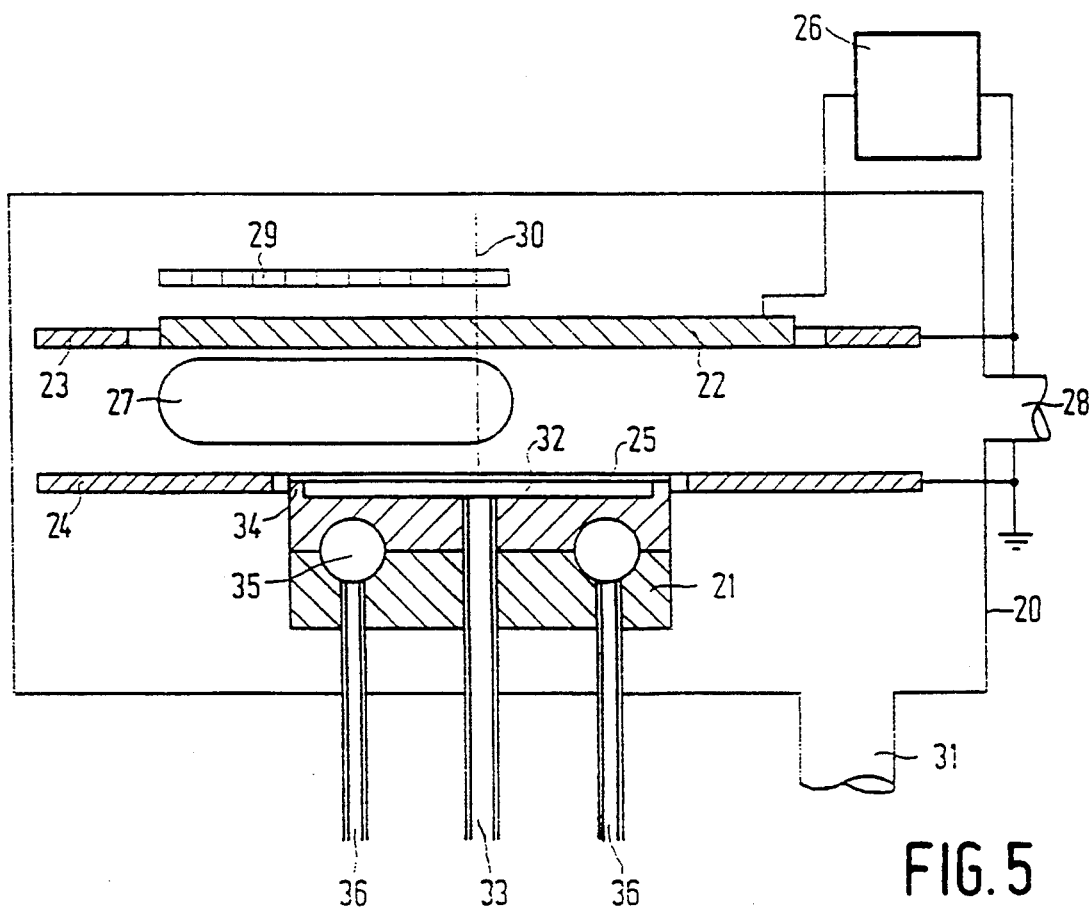

FIG. 5 diagrammatically shows one of the deposition chambers of the multiple-chamber deposition device. A support 21 is arranged in the reaction chamber 20 parallel to a plane target 22 and to a plane grounded conductive ring 23 surrounding the target 22. An earthed screen 24 is provided around the support. A slice of semiconductor material 25 is placed on the support 21, after which argon is introduced into the reaction chamber. A usual DC voltage source 26 is connected between the target 22 and the conductive ring 23 surrounding the target 22, so that a voltage of between 300 and 700 V generates a plasma which is kept confined between the target 22 and the slice 25 and in a space 27 close to the target 22 by magnets 29 arranged behind the target. The argon is introduced into the reaction chamber through a gas inlet 28.

The magnets 29 are jointly rotatable about an axis 30. In practice, they rotate a few times every second about the axis 30 during the deposition process, so that the plasma and the space 27 in which it is confined are rotated about the same axis 30. It is achieved by this that atoms are sputtered homogeneously from the entire surface of the target 22 and that a homogeneous deposition over the entire slice 25 is obtained.

The slice 25 was cooled during deposition in that a gas cushion 32 with a pressure of 100 to 2000 Pa was maintained between the support 21 and the semiconductor slice 25. Argon is conducted between the support 21 and the slice 25 through a gas line 33. The support 21 is provided with an edge 34 against which the slice 25 is pressed by clamps (not shown). Argon leakage from the gas cushion 32 into the reactor chamber 20 is restricted by this. The support 21 is cooled in that cooling water is conducted through lines 36 into a channel 35 provided in the support 21.

The chamber 20 is further provided with a gas outlet 31 which is connected to a pump (not shown) by which gases can be removed and by which the reaction chamber 20 can be kept at a desired pressure.

In the tests to be described below, and in a multiple-chamber deposition device described above, a 100 nm thick barrier layer of $Ti_xW_{1-x}$ and a usual 500 nm thick aluminium layer comprising 1 vol. % silicon were deposited in that order on several silicon slices provided with a layer of silicon oxide. The layers were deposited under different sputtering conditions by means of a sputtering target of $Ti_yW_{1-y}$ with $y=0.3$. The two layers were provided on some slices without the slices being taken from the deposition device, whereas other slices were taken from the deposition device between the deposition operations of the two layers and exposed to air for one hour or several days. Barrier layers were thus investigated during the tests which had not been exposed to air before deposition of the aluminium layer and barrier layers which had.

Silicon slices provided with the barrier layer and the aluminium layer were heated in vacuum for some time at a temperature of 450° C. The electrical square resistance of the aluminium layer was measured during this. Since chemical compounds generated by reactions between titanium and tungsten from the barrier layer and aluminium have a resistance which is much greater than that of aluminium, the measured resistance increases as aluminium is converted into these compounds. It was calculated from the increase of this resistance how much aluminium was consumed for the conversion into one of the said compounds. The aluminium layer becomes as it were thinner. This thickness reduction is given as a measure for the quantity of aluminium consumed in the following test results.

Figure 6:
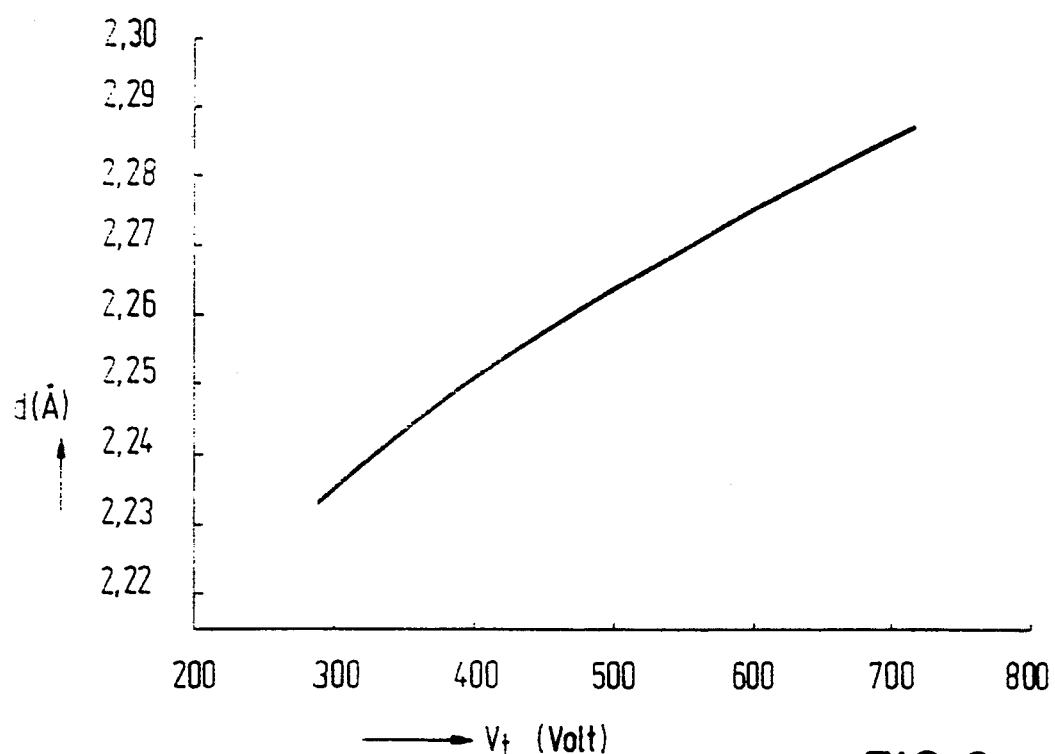
FIG. 6 shows the lattice distance between tungsten (100) faces in the deposited barrier layer.

The distance between (100) lattice faces of tungsten was also measured for the deposited barrier layers by means of X-ray diffraction. FIG. 6 shows this lattice distance d in Å as a function of the voltage $V_t$ applied between the target 22 and the conductive ring 23 surrounding the target. The target 22 had a diameter of 26 cm in the tests. The conductive ring 23 had an internal diameter of 26.5 cm and an external diameter of 30 cm. The slices had a diameter of 15 cm. The slices were cooled during the tests so that their temperatures did not rise above 200° C.

Figure 7:
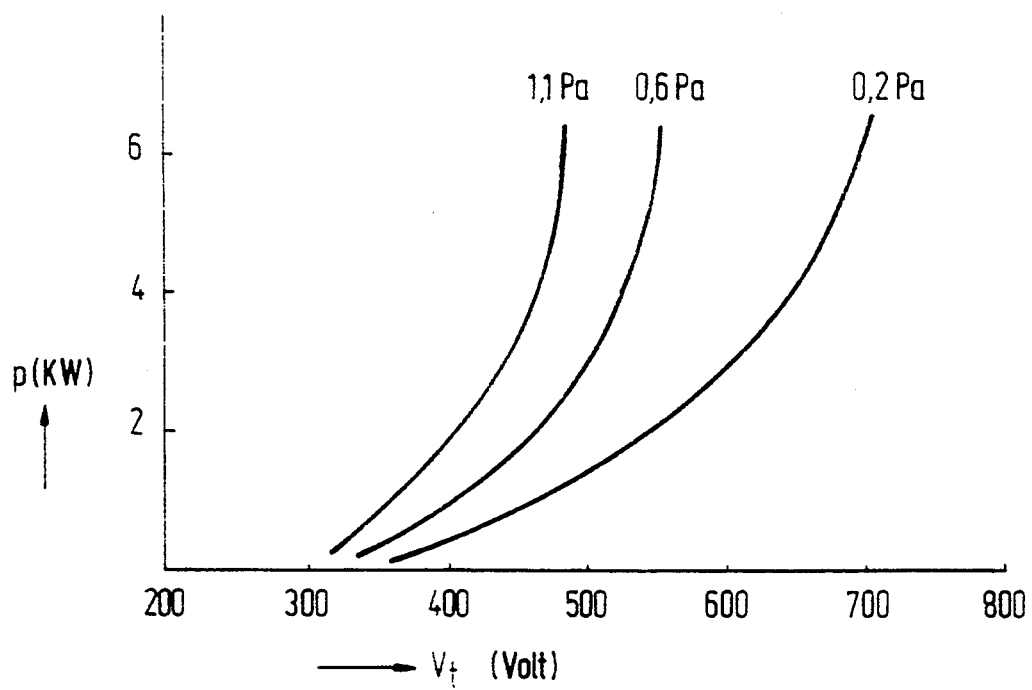
FIG. 7 shows the power dissipated in the plasma as a function of the voltage at the target in the chamber of FIG. 7 for several argon pressures in the reaction chamber.

As is apparent from FIG. 7, which shows the power P in kW dissipated in the reaction chamber 20 as a function of the voltage $V_t$ between the target 22 and the conductive ring 23 for some pressures (0.3, 1 and 2 Pa) of the argon in the reaction chamber 20, this voltage $V_t$ may be realized in various ways.

Figure 8:
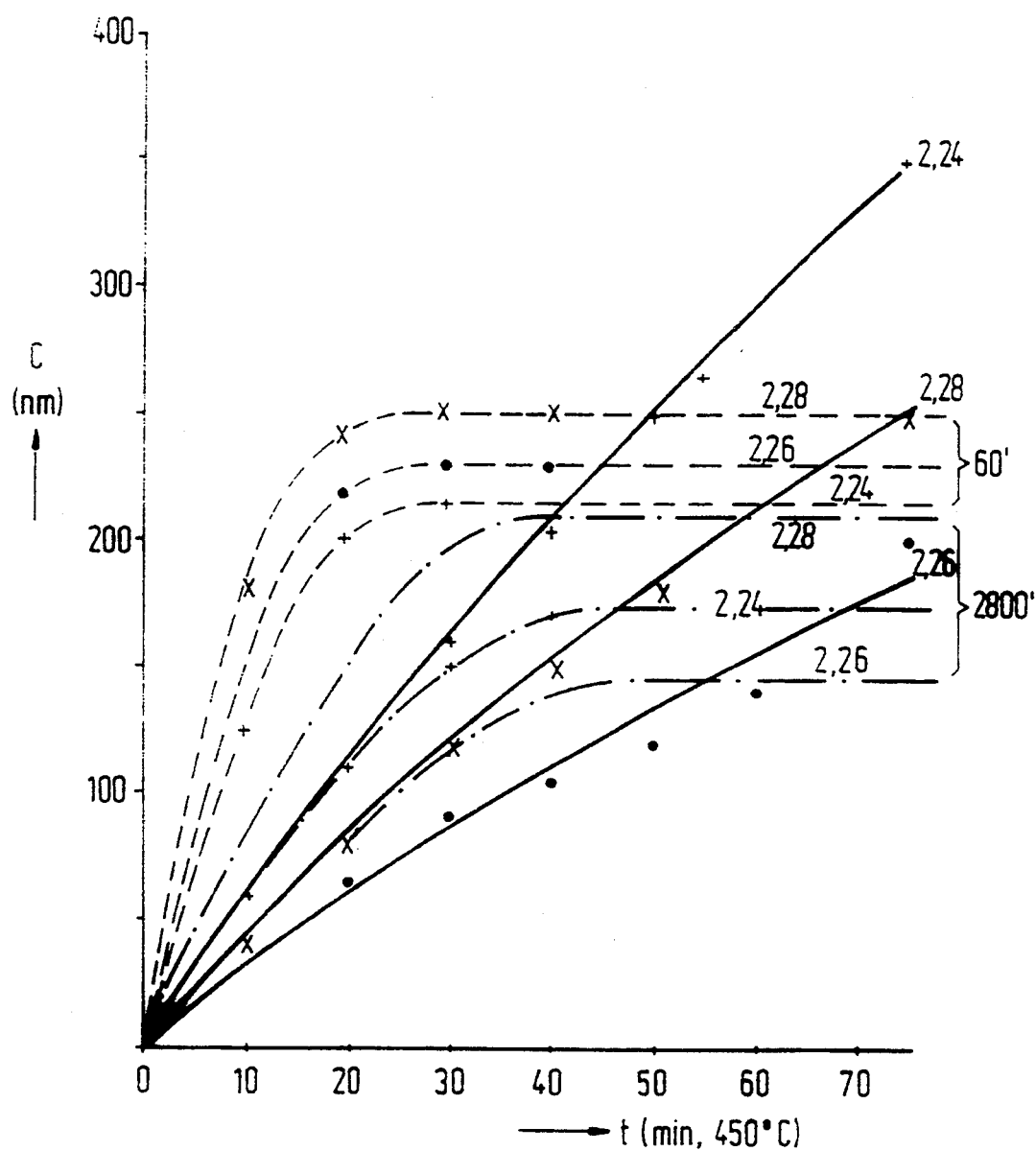
FIG. 8 shows the consumption C in nm of the aluminium layer as a function of time in minutes during heating at 450° C.

FIG. 8 shows the consumption C in nm of the aluminium layer as a function of time in minutes during vacuum heating at 450° C. The drawn lines show the consumption on slices on which the aluminium layer was directly deposited on the barrier layer, the broken lines show the consumption on slices on which the aluminium layer was deposited after the barrier layer had been exposed to air for 60 minutes, while the dash-dot lines show the consumption on slices on which the aluminium layer was deposited after the barrier layer had been exposed to air for 2 days. To keep the Figure simple, these consumptions are represented for three kinds of barrier layers only, i.e. layers with a distance between the (100) tungsten lattice faces of 2.24Å, 2.26Å and 2.28Å.

Figure 9:
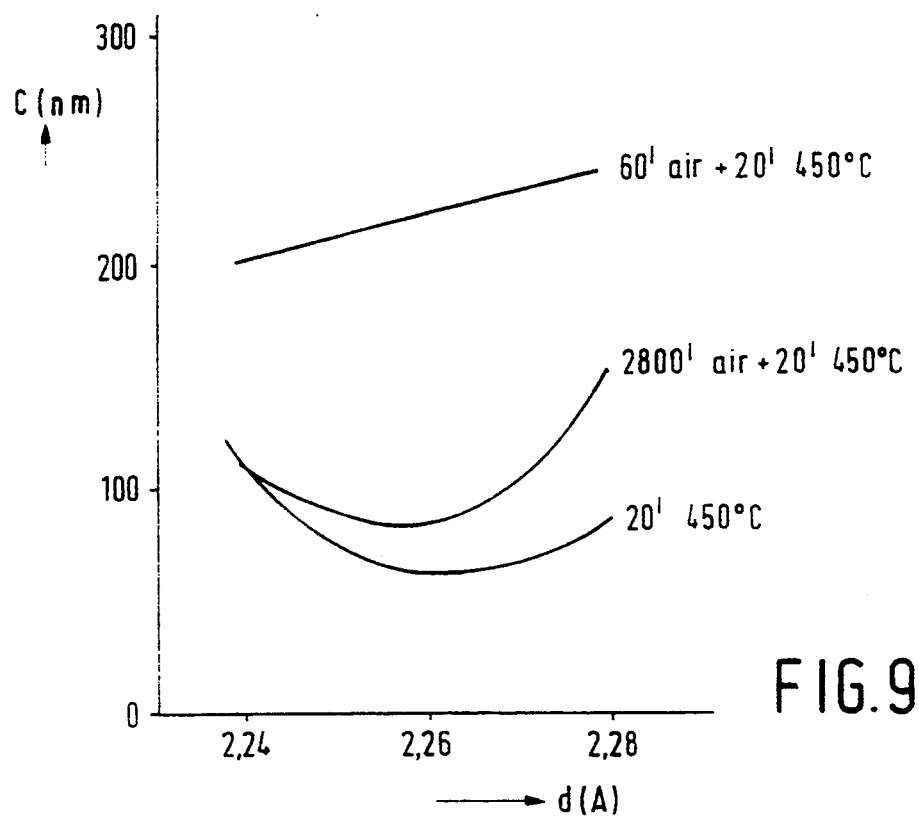
FIGS. 9, 10 and 11 show the consumption C of aluminium during heating at 450° C. after 20, 30, or 40 or more minutes, respectively, as a function of the distance between the tungsten (100) lattice faces on slices on which the barrier layer had not been exposed to air and had been exposed to air for 60 minutes and 2800 minutes before the aluminium layer was deposited.
Figure 10:
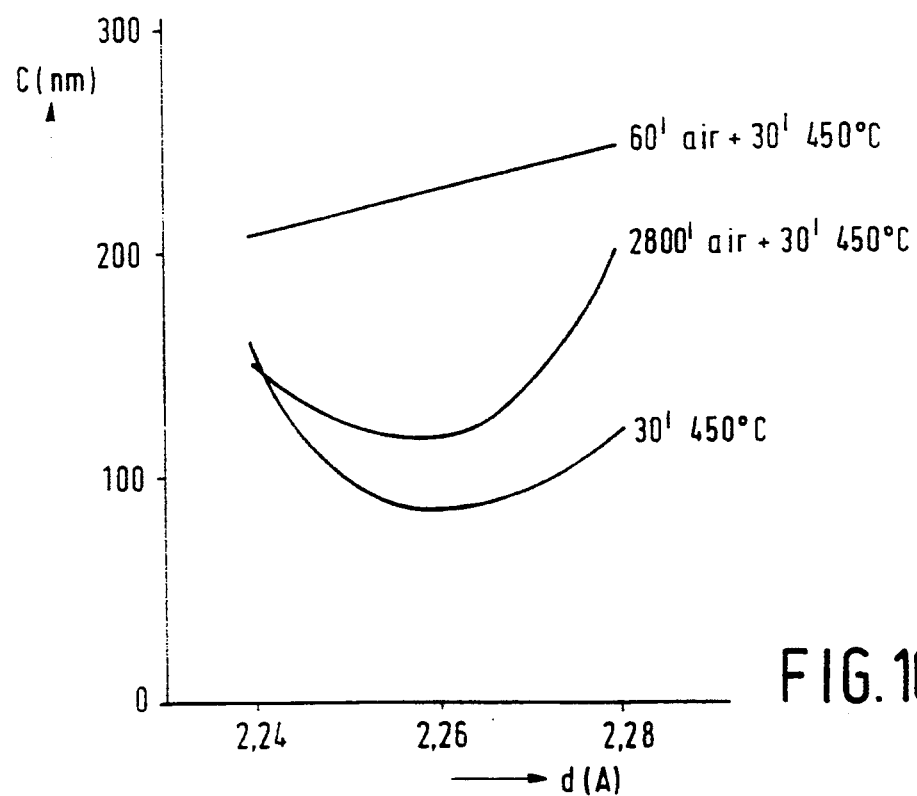
Figure 11:
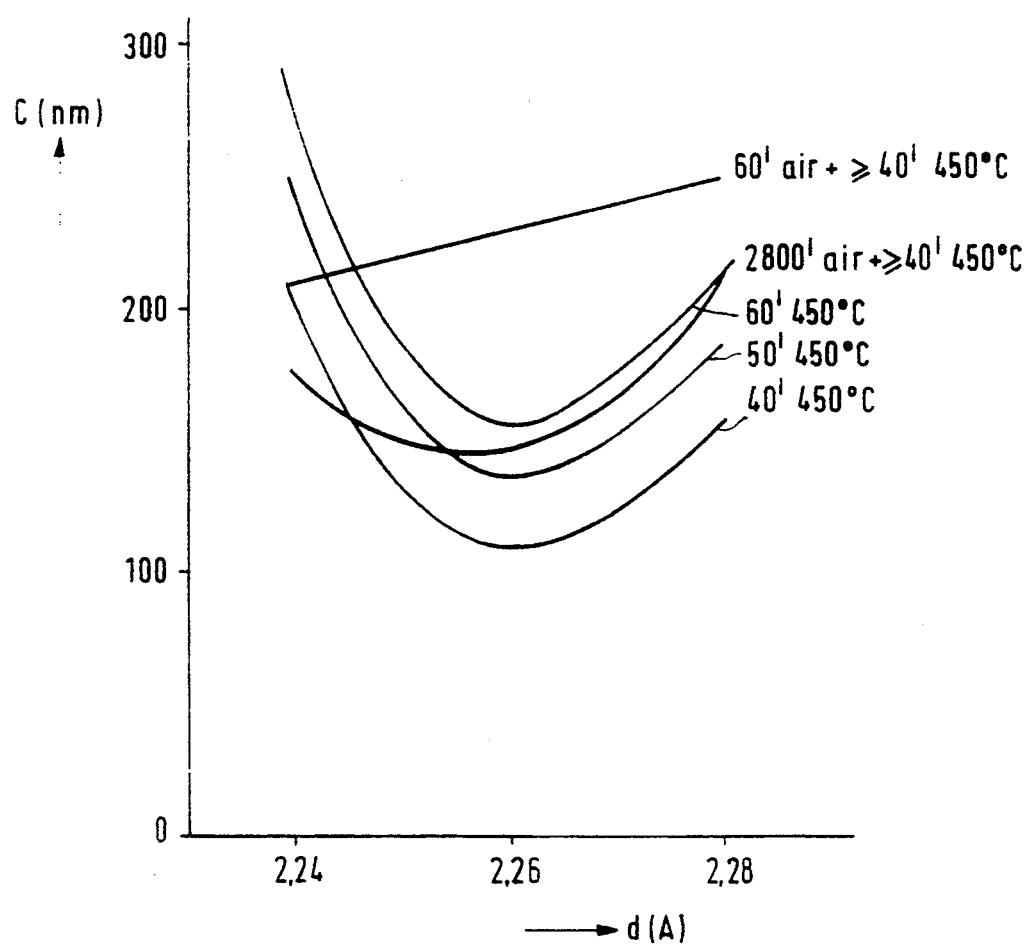

FIGS. 9, 10 and 11 show the consumption of the aluminium layer as a function of the distance between the tungsten (100) lattice surfaces d in Å on slices on which the barrier layer had not been exposed to air, had been exposed for 60 minutes and had been exposed for 2 days (=2800 minutes) to air before the aluminium layer was deposited. FIG. 9 shows the consumption figures after 20 minutes of heating in vacuum at 450° C., FIG. 10 after 30 minutes and FIG. 11 after 40, 50 and 60 minutes. In the case shown in FIG. 11, there was no discernible difference in consumption after 40, 50 and 60 minutes heating at 450° C. of aluminium deposited on the barrier layers exposed to air.

In practice, semiconductor slices are subjected to heat treatments which cause less aluminium consumption during further process steps, after the deposition of the $Ti_xW_{1-x}$ barrier layer 8 and the aluminium layer 9, than the heat treatment carried out during the tests. During the manufacture of the semiconductor device described above (FIGS. 1 to 3), for example, the slice was heated for a total of 60 minutes at a temperature of 425° C. A heat treatment of 60 minutes at 425° causes an aluminium consumption which is much less—in practice approximately one third—than the aluminium consumption caused by a heat treatment of 60 minutes at a temperature of 450° C. Conductor patterns 8 and 14 were formed in two layers in the semiconductor device described above. No heat treatments are used in practice in such a modern "double-metal process" which cause a greater aluminium consumption than a heat treatment of 60 minutes at 450° C.

It is evident from FIGS. 9, 10 and 11 that a barrier layer of $Ti_xW_{1-x}$ with x=0.3 in which the distance between the (100) tungsten lattice faces is greater than 2.25Å causes less aluminium consumption, and accordingly has equally good or even better barrier properties as/than a $Ti_xW_{1-x}$ barrier layer which has been exposed to air for a few days. If the distance between the (100) lattice faces of W is greater than 2.25Å but smaller than 2.27Å in the barrier layer, the aluminium consumption in a barrier layer not exposed to air is not only smaller than that in a barrier layer exposed to air, but in addition has a minimum value.

FIG. 6 shows that the barrier layer according to the invention may be readily deposited by means of the deposition device described above (FIGS. 4 and 5). To manufacture the semiconductor device with the semiconductor body 1 whose surface 4 is provided with a barrier layer 8 of $Ti_xW_{1-x}$, with 0.1<x<0.3, this barrier layer is deposited in the chamber 18 in that the slice 25 is placed on the support 21 in the reaction chamber 20 opposite a $Ti_yW_{1-y}$ target, with 0.1<y<0.3. Then argon is conducted into the reaction chamber and a plasma is generated in the space 27. The voltage between the target 22 and the conductive ring 23 surrounding the target is kept at such a value during deposition that a barrier layer is formed in which the distance between the (100) lattice faces of W is greater than 2.25Å.

Surprisingly, there is a relation between the voltage between the target 22 and the ring 23 on the one hand and the distance between the said lattice faces on the other hand, so that it is possible to control the deposition process in such a manner that a layer with the desired lattice distance is deposited. To ensure that the distance between the (100) lattice faces of W is greater than 2.25Å, according to the invention, a voltage above 400 V is applied between the target 22 and the conductive ring 23 surrounding the target during the deposition. The layer formed in this manner exhibits the said equally good or even better barrier properties compared with a layer which has been exposed to air for a few days.

Preferably, such a voltage is applied between the target 22 and the conductive ring 23 surrounding the target during deposition that a barrier layer is formed in which the distance between the (100) lattice faces of W is greater than 2.25Å but smaller than 2.27Å. In that case, according to the invention, a voltage between the target 22 and the conductive ring 23 surrounding the target above 400 V and below 550 V is applied during the deposition. A layer is then formed whose barrier properties are not only better than those of a barrier layer exposed to air, but which in addition have an optimum value.

FIG. 7 shows that the voltage between the target 22 and the ring 23 surrounding the target may be realized in various ways. Preferably, the deposition process is so carried out that the barrier layer of approximately 100 nm thickness is deposited in approximately 10 to 30 seconds. It is found in practice that such a process is realized if argon is fed into the reaction chamber under a pressure of 0.6 to 1.2 Pa during the deposition, while an electric power of 3500 to 4500 W is supplied to the plasma.

The tests described above were carried out by means of a deposition process in which $Ti_xW_{1-x}$ barrier layers were deposited in a deposition device with a $Ti_yW_{1-y}$ target, y being 0.3. It is noted that similar results were obtained with targets of a different composition, where 0.1<y<0.3. The $Ti_xW_{1-x}$ layers deposited always had a composition with 0.1<x<0.3. The composition of the barrier layer depends not only on the composition of the target used but also on the deposition conditions. Thus it was found that a layer deposited by means of a target with y=0.3 and having distances between the (100) tungsten lattice faces of 2.24Å, 2.26Å, and 2.28Å, the fractions x were 0.28, 0.23 and 0.21, respectively.

We claim:

1. A semiconductor device with a semiconductor body of which a surface is provided with a barrier layer of $Ti_xW_{1-x}$, with 0.1<x<0.3, characterized in that the distance between the (100) lattice faces of W is greater than 2.25Å in the barrier layer.

2. A semiconductor device as claimed in claim 1, characterized in that the distance between the (100) lattice faces of W is greater than 2.25Å but smaller than 2.27Å in the barrier layer.

* * * * *